(12) United States Patent
Chen et al.

(10) Patent No.: US 11,515,456 B2
(45) Date of Patent: Nov. 29, 2022

(54) LED WITH LIGHT ADJUSTING LAYER EXTENDING PAST THE LED

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 96 days.

(21) Appl. No.: 16/282,272

(22) Filed: Feb. 21, 2019

(65) Prior Publication Data
US 2020/0274039 A1 Aug. 27, 2020

(51) Int. Cl.
| | |
|---|---|
| *H01L 33/58* | (2010.01) |
| *H01L 25/075* | (2006.01) |
| *H01L 33/00* | (2010.01) |
| *H01L 25/16* | (2006.01) |
| *H01L 33/62* | (2010.01) |

(52) U.S. Cl.
CPC .......... *H01L 33/58* (2013.01); *H01L 25/0753* (2013.01); *H01L 25/167* (2013.01); *H01L 33/0093* (2020.05); *H01L 33/62* (2013.01); *H01L 2933/0058* (2013.01); *H01L 2933/0091* (2013.01)

(58) Field of Classification Search
CPC ... H01L 33/58; H01L 25/0753; H01L 25/167; H01L 33/0079; H01L 33/62; H01L 2933/0058; H01L 2933/0091
See application file for complete search history.

(56) References Cited

U.S. PATENT DOCUMENTS

| | | | |
|---|---|---|---|
| 9,111,462 B2 | 8/2015 | Sitrick | |
| 2005/0167682 A1* | 8/2005 | Fukasawa | H01L 33/60 257/79 |
| 2008/0116467 A1 | 5/2008 | Mueller | |
| 2011/0193127 A1* | 8/2011 | Won | H01L 33/642 257/99 |
| 2011/0297972 A1* | 12/2011 | Seo | H01L 25/0753 257/88 |
| 2012/0037950 A1* | 2/2012 | Chiang | H01L 33/44 257/100 |

(Continued)

FOREIGN PATENT DOCUMENTS

| | | | | |
|---|---|---|---|---|
| CN | 103594654 A * | 2/2014 | ......... | H01L 51/5209 |
| EP | 2 197 051 A2 | 6/2010 | | |

(Continued)

*Primary Examiner* — Peter Bradford
(74) *Attorney, Agent, or Firm* — Winston Hsu

(57) ABSTRACT

The present disclosure provides a lighting device and a manufacturing method thereof. The lighting device of an embodiment includes a substrate, a light emitting unit and a light adjusting layer. The light emitting unit is disposed on the substrate, and the light emitting unit includes a light output surface. The light adjusting layer is disposed on the light emitting unit, and the light adjusting layer includes a first portion and a second portion connected to the first portion. Wherein, the first portion only partially covers the light output surface, and the second portion does not cover the light output surface.

10 Claims, 14 Drawing Sheets

(56) References Cited

U.S. PATENT DOCUMENTS

| | | | |
|---|---|---|---|
| 2014/0021501 A1 | 1/2014 | Chen | |
| 2015/0325748 A1* | 11/2015 | Ting | H01L 33/38 |
| | | | 257/98 |
| 2017/0062674 A1 | 3/2017 | Kwon | |
| 2017/0133818 A1 | 5/2017 | Cok | |
| 2017/0242549 A1 | 8/2017 | Lim | |
| 2017/0294560 A1* | 10/2017 | Ho | H01L 25/0753 |
| 2019/0027658 A1* | 1/2019 | Gould | H01L 33/005 |

FOREIGN PATENT DOCUMENTS

| | | | | |
|---|---|---|---|---|
| EP | 2 197 051 A3 | 6/2011 | | |
| EP | 2 410 583 A2 | 1/2012 | | |
| EP | 2 741 338 A1 | 6/2014 | | |
| EP | 2 833 421 A1 | 2/2015 | | |
| EP | 2 410 583 A3 | 4/2015 | | |
| JP | 2010157679 A * | 7/2010 | | H01L 33/385 |
| KR | 20170125587 A * | 11/2017 | | |

\* cited by examiner

LED WITH LIGHT ADJUSTING LAYER EXTENDING PAST THE LED

BACKGROUND OF THE DISCLOSURE

1. Field of the Disclosure

The present disclosure relates to a lighting device and a manufacturing method thereof, and more particularly to a lighting device and a manufacturing method thereof having a light adjusting layer for making an emitting light uniform.

2. Description of the Prior Art

As the evolution and development of electronic devices, the electronic devices are widely used and have become an indispensable item in these days. For example, a lighting device, which is a kind of the electronic devices, may have been used in any suitable electronic products with display function, such as televisions, monitor, notebooks, smart phones, watches, and display devices in vehicles, so as to transmit and display information more conveniently.

In general, the electronic device may have a light emitting unit, such as light-emitting diode (LED), to emit light. The edge region of one individual light emitting unit may be damaged due to the manufacturing process such as etching, thus resulting in excessive centralized or concentrated light. Furthermore, when the size of the light emitting unit is reduced for enhancing the resolution or decreasing the size of the electronic device, the damaged region will not be reduced. Therefore, the damaged region of the light emitting unit will have a high ratio, which makes the phenomenon of centralization of light more severe, thus resulting in non-uniform light and less light output.

SUMMARY OF THE DISCLOSURE

According to an embodiment, the present disclosure provides a lighting device including a substrate, a light emitting unit and a light adjusting layer. The light emitting unit is disposed on the substrate, and the light emitting unit includes a light output surface. The light adjusting layer is disposed on the light emitting unit, and the light adjusting layer includes a first portion and a second portion connected to the first portion. The first portion only partially covers the light output surface, and the second portion does not cover the light output surface.

According to another embodiment, the present disclosure provides a lighting device including a substrate, a light emitting unit and a light adjusting layer. The light emitting unit is disposed on the substrate, and the light emitting unit includes a light output surface. The light adjusting layer is disposed on the light emitting unit, and the light adjusting layer includes a first portion and a second portion connected to the first portion, wherein the light adjusting layer includes an inorganic insulating material. The first portion covers the light output surface, and the second portion does not cover the light output surface.

According to another embodiment, the present disclosure provides a method for manufacturing a lighting device including following steps: providing a first substrate supporting a light emitting unit and a light adjusting layer disposed on the light emitting unit, wherein the light emitting unit includes a light output surface, and the light adjusting layer includes a first portion and a second portion connected to the first portion; providing a second substrate; and transferring the light emitting unit and the light adjusting layer to the second substrate. The first portion covers the light output surface, and the second portion does not cover the light output surface.

These and other objectives of the present disclosure will no doubt become obvious to those of ordinary skill in the art after reading the following detailed description of the embodiment that is illustrated in the various figures and drawings.

DETAILED DESCRIPTION

Figure 1:
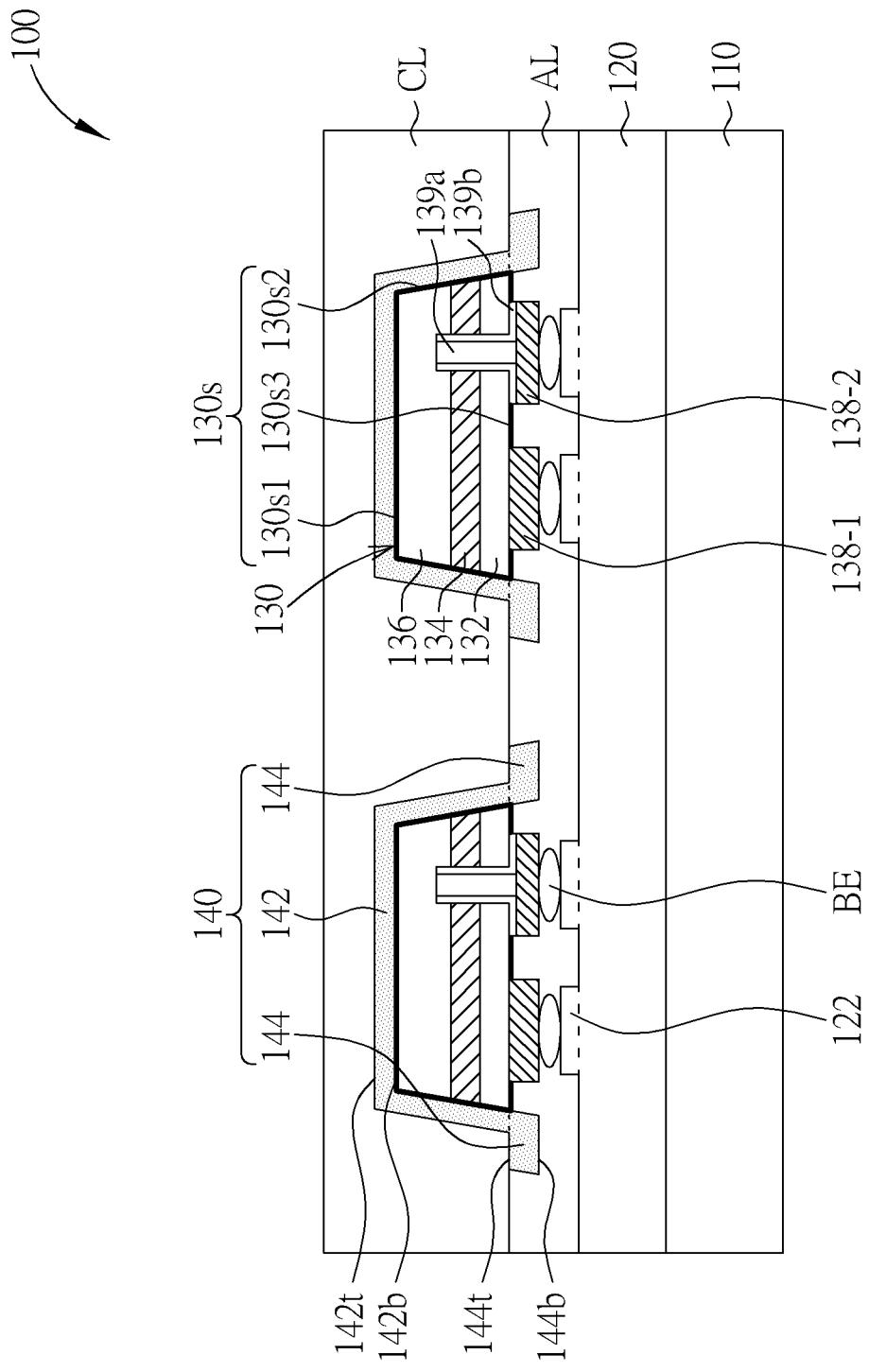
FIG. 1 is a schematic diagram showing a cross-sectional view of a lighting device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components. In the present disclosure, if not described by any adjective, the term "cover" can mean "partially cover" or "completely cover".

When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them.

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented. In addition, when the component is referred to "be coupled to/with another component (or the variant thereof)", it may be directly connected to another component, or may be indirectly connected (such as electrically connected) to another component through other component or components.

It should be noted that the technical features in different embodiments described in the following can be replaced, recombined, or mixed with one another to constitute another embodiment without departing from the spirit of the present disclosure.

In the present disclosure, a lighting device is a suitable electronic device which can emit light. In some embodiments, the lighting device may be the electronic device with display function, such as a LED display, a micro LED display, a mini LED display, an OLED (organic light-emitting diode) display, a QLED (quantum dots light-emitting diode) display, a flexible display or other suitable self-luminous display. Or, in some embodiments, the lighting device may be a component of the electronic device with display function, such as a backlight module of the LC (liquid crystal) display.

Figure 2A:
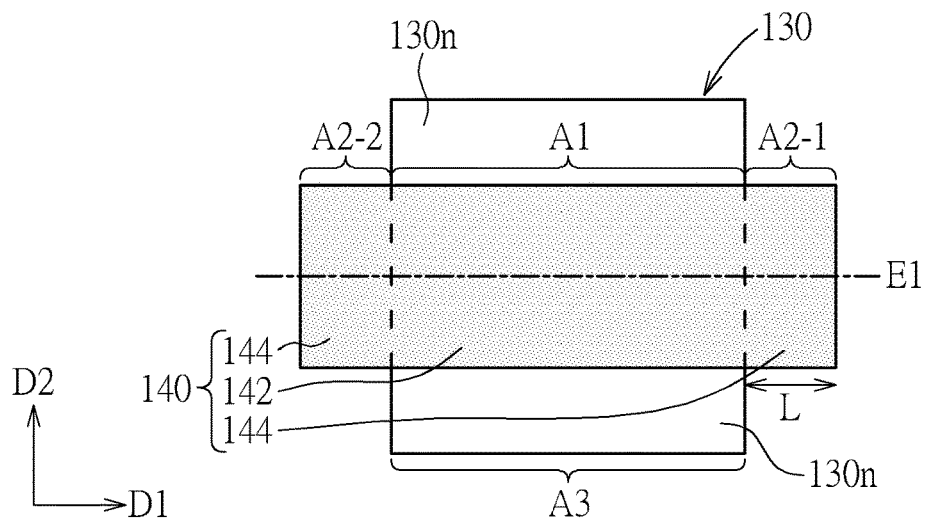
FIG. 2A is a schematic diagram showing a top view of a light emitting unit and a light adjusting layer according to the first embodiment of the present disclosure.

Referring to FIG. 1 and FIG. 2A, FIG. 1 is a schematic diagram showing a cross-sectional view of a lighting device according to a first embodiment of the present disclosure, and FIG. 2A is a schematic diagram showing a top view of a light emitting unit and a light adjusting layer according to the first embodiment of the present disclosure. As shown in FIG. 1 and FIG. 2A, the lighting device 100 of this embodiment includes a substrate 110, a circuit layer 120, one or more light emitting unit(s) 130 and a light adjusting layer 140. The substrate 110 may be a hard substrate such as a glass substrate, a plastic substrate, a quartz substrate, a sapphire substrate, a circuit board (e.g. printed circuit board) or other suitable hard substrate, or may be a flexible substrate including polyimide (PI), polyethylene terephthalate (PET) and/or other suitable flexible material, but not limited thereto. The type and material of the substrate 110 may be selected according to the application of the lighting device 100; for example, the substrate 110 may be a glass substrate if the lighting device 100 is served as a non-flexible micro LED display, and the substrate 110 may be a circuit board if the lighting device 100 is served as a backlight module, but not limited thereto.

According to this embodiment, the circuit layer 120 is disposed on the substrate 110, a plurality of light emitting units 130 are disposed on the circuit layer 120, and the circuit layer 120 is configured to drive the light emitting units 130 for emitting light. In detail, the circuit layer 120 may include at least one conductive layer, at least one insulating layer and/or at least one semiconductor layer to form a plurality of electronic components, such as traces, thin film transistors, capacitor or other suitable components, and the light emitting units 130 are electrically connected to at least one of the electronic components respectively. The conductive layer may include metal, and/or transparent conductive material. The transparent conductive material can includes indium tin oxide (ITO), indium zinc oxide (IZO)) and/or other suitable conductive material. The material of each insulating layer may individually include silicon oxide, silicon nitride and/or silicon oxynitride. The material of each semiconductor layer may include low temperature poly-silicon (LTPS), indium gallium zinc oxide (IGZO) or amorphous silicon (a-Si), but the present disclosure is not limited thereto.

The circuit layer 120 may include at least one bonding pad 122 formed of the uppermost conductive layer, and one of the light emitting units 130 is electrically connected to the electronic components included in the circuit layer 120 through the bonding pad 122. In addition, the lighting device 100 of this embodiment may further include an integrated circuit (not shown in figures) electrically connected to the electronic components included in the circuit layer 120 and the light emitting unit 130, such that the integrated circuit and the electronic components of the circuit layer 120 may drive the light emitting units 130 for emitting light, but not limited thereto. In another embodiment, the electronic components of the circuit layer 120 may form a driving circuit to drive the light emitting units 130.

One of the light emitting units 130 may be a LED, a micro LED, a mini LED, an OLED, a QLED or other suitable light emitting component. For example, if the lighting device 100 is served as a self-luminous display, the light emitting unit 130 may be a component disposed within a sub-pixel; if the lighting device 100 is served as a backlight module, the light emitting unit 130 may be a component providing backlight, but not limited thereto. In this embodiment, as shown in FIG. 1, the light emitting unit 130 may include a first semiconductor layer 132, a light emitting layer 134 disposed on the first semiconductor layer 132, and a second semiconductor layer 136 disposed on the light emitting layer 134. For example, the first semiconductor layer 132 may be a p-type semiconductor layer, the second semiconductor layer 136 may be an n-type semiconductor layer, and the light emitting layer 134 is a multiple quantum well (MQW), but not limited thereto. Note that the light emitting unit 130 may include suitable material based on the type of LED and the color of the light. Moreover, the light emitting unit 130 includes a first electrode 138-1 and a second electrode 138-2. The first electrode 138-1 is electrically connected to the first semiconductor layer 132, and the second electrode 138-2 is electrically connected to the second semiconductor layer 136. In this embodiment, the light emitting unit 130 is flip-chip type, the first electrode 138-1 and the second electrode 138-2 are disposed on the same side of the light emitting unit 130, and each of the first electrode 138-1 and the second electrode 138-2 is electrically connected to one bonding pad 122 of the circuit layer 120 with bonding element BE respectively. The second electrode 138-2 is electrically connected to the second semiconductor layer 136 through an inner connecting component 139a and the inner connecting component 139a is separated from the first semiconductor layer 132 by an inner insulator 139b, but the connection method is not limited thereto. Based on requirements, the positions of the first electrode 138-1 and the second electrode 138-2 may be adjusted. In addition, the material of the first electrode 138-1 and the second electrode 138-2 may be metal, but not limited thereto. Furthermore, the light emitting unit 130 may optionally include buffer layer or other suitable layer for instance.

In the present disclosure, the light emitting unit 130 includes a light output surface 130s (indicated as a bold line in FIG. 1), and the light output surface 130s is defined as a surface which the light emitted from the light emitting layer 134 may pass through. For example, in FIG. 1, when the first electrode 138-1 and the second electrode 138-2 include metal and can shield the light emitted from the light emitting layer 134, the surface that occupied by the first electrode 138-1 and the second electrode 138-2 does not belong to the light output surface 130s.

The edge region of one individual light emitting unit may be damaged due to the manufacturing process such as etching, thus resulting in excessive centralized or concentrated light. Furthermore, the damaged region of the light emitting unit will have a high ratio when the size of the light emitting unit is reduced, which makes the phenomenon of centralization of light more severe, thus resulting in non-uniform light and less light output. In order to make the light emitted from the light emitting unit 130 uniform, the light adjusting layer 140 is disposed on the light emitting unit 130 for adjusting an optical path of the emitting light. In some embodiments of the present disclosure, the disposition and the design of the light adjusting layer 140 can result in more uniform light and effective light output. The light adjusting layer 140 has a refractive index different from a refractive index of the uppermost layer of the light emitting unit 130 (e.g. the second semiconductor layer 136). For example, the emitting light may be scattered through the light adjusting layer 140, but not limited thereto. In some embodiments, the light adjusting layer 140 may include an inorganic insulating material. For example, the inorganic insulating material may include silicon nitride, silicon oxide, aluminum oxide, titanium oxide, or a combination thereof, but not limited thereto. In another embodiment, the light adjusting layer 140 may include an organic insulating material. Moreover, the light adjusting layer 140 may be a single-layer structure or a multi-layer structure, wherein the multi-layer structure may include a plurality of inorganic insulating layers, a plurality of organic insulating layers, or a combination of at least one inorganic insulating layer and at least one organic insulating layer.

Specifically, as shown in FIG. 1 and FIG. 2A, the light adjusting layer 140 includes a first portion 142 and a second portion 144. The second portion 144 can be defined as the portion not covering the light output surface 130s, and the first portion 142 can be the portion excluding the second portion 144. In detail, the first portion 142 can cover the light output surface 130s of the light emitting unit 130. In some embodiments, the first portion 142 can completely cover the light output surface 130s. In some embodiments, the first portion 142 can partially cover the light output surface 130s. The second portion 144 is connected to the first portion 142 and does not cover the light output surface 130s of the light emitting unit 130. According to some embodiments, as shown in FIG. 1, one individual light emitting unit 130 is covered by one individual light adjusting layer 140, but not limited thereto. That is, the light adjusting layer covering one light emitting unit and the light adjusting layer covering another light emitting unit may be not continuous. In some embodiments, in a top view, a projected area (A1) of the first portion 142 may be greater than a projected area (sum of A2-1 and A2-2) of the second portion 144. In some embodiments, a ratio of the projected area (A1) of the first portion 142 to a projected area (A3) of the light output surface 130s may be greater than or equal to 1/10 and less than 1, but not limited thereto.

Furthermore, in some embodiments, as shown in FIG. 1 and FIG. 2A, the first portion 142 only partially covers the light output surface 130s. Since the light output surface 130s is not completely covered, the heat generated from the light emitting unit 130 may be effectively dissipated. In detail, the light output surface 130s is the surface including the outer contour of the light emitting unit 130, but excluding the part occupied by the electrodes 138-1 and 138-2 if the electrodes include metal. The light output surface 130s includes a top surface 130s1, a side surface 130s2 and a bottom surface 130s3. As shown in FIG. 2A, the first portion 142 of the light adjusting layer 140 can cover a part of the top surface 130s1, and a part of the side surface 130s2 of the light output surface 130s. In detail, in a top view of FIG. 2A, the light adjusting layer 140 extends along a first direction D1, and the first portion 142 and the second portion 144 are connected along the first direction D1. The first portion 142 only partially overlap the light emitting unit 130, and a part of the light emitting unit 130 (labeled as 130n) is not overlapped by the first portion 142.

Figure 2B:
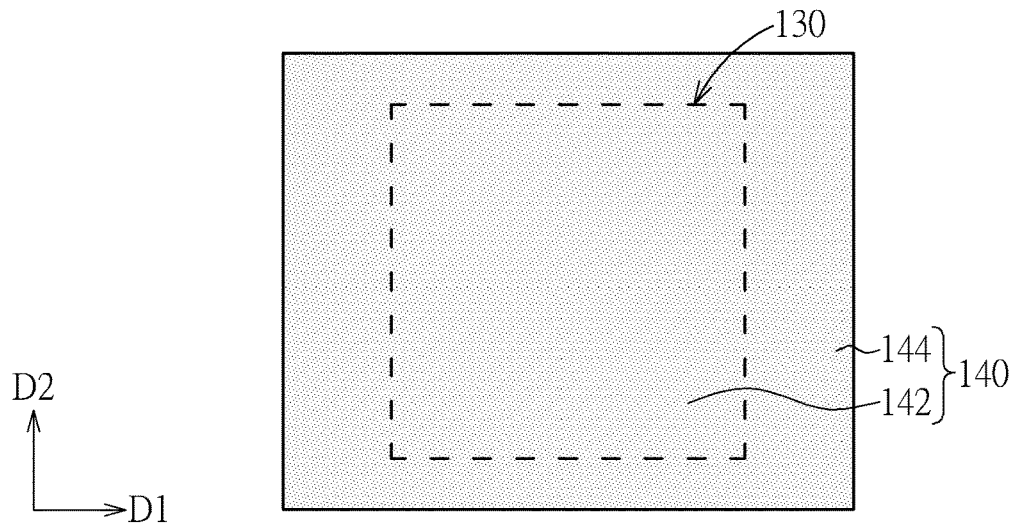
FIG. 2B-2C are schematic diagrams respectively showing a top view of the light emitting unit and the light adjusting layer of FIG. 1 according to a various embodiment.
Figure 2C:
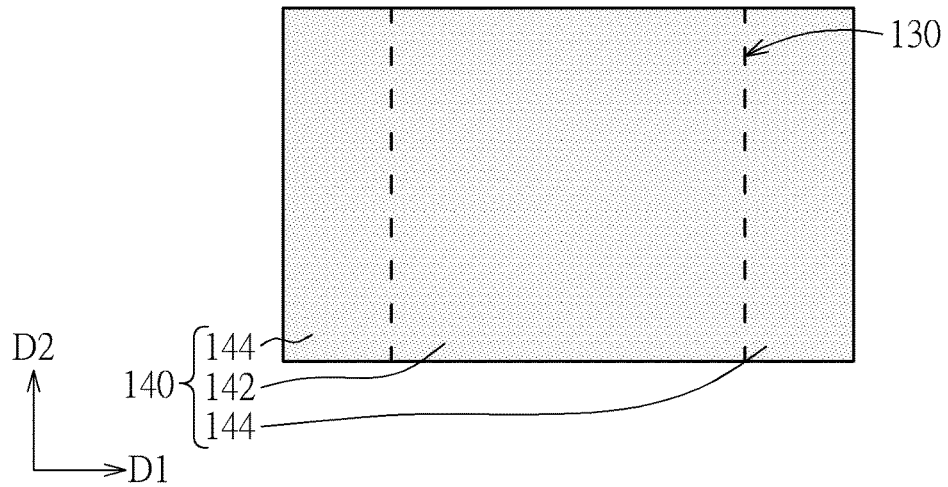

In addition, according to a various embodiment, FIG. 2B is a schematic diagram showing a top view of the light emitting unit and the light adjusting layer of FIG. 1. As shown in FIG. 1 and FIG. 2B, the first portion 142 of the light adjusting layer 140 can cover entire part of the top surface 130s1, and entire part of the side surface 130s2 of the light output surface 130s. In detail, in a top view of FIG. 2B, the first portion 142 can completely overlap the light emitting unit 130, and the second portion 144 can extend along the first direction D1 and a second direction D2 and surround the first portion 142. The first direction D1 and the second direction D2 can be perpendicular. In addition, according to a various embodiment, FIG. 2C is a schematic diagram showing a top view of the light emitting unit and the light adjusting layer of FIG. 1. As shown in FIG. 1 and FIG. 2C, the first portion 142 of the light adjusting layer 140 can cover entire part of the top surface 130s1, and a part of the side surface 130s2 of the light output surface 130s. In detail, in a top view of FIG. 2C, the first portion 142 can completely overlap the light emitting unit 130, and the second portion 144 is only present in the first direction D1, but not present in the second direction D2.

On the other hand, a part of the emitted light may be adjusted and pass through the second portion 144 of the light adjusting layer 140, such that the second portion 144 may make the view angle wider. According to some embodiments, a ratio of the projected area (sum of A2-1 and A2-2) of the second portion 144 to the projected area (A3) of the light output surface 130s may be greater than 0 and less than or equal to ½. According to some embodiments, in a top view, a minimum distance L between a point of the second portion 144 farthest from the light output surface 130s and the light output surface 130s may range from 30 μm auto 100 μm, but not limited thereto. This area ratio and this minimum distance L are related to a thickness of the light emitting unit 130.

Figure 4:
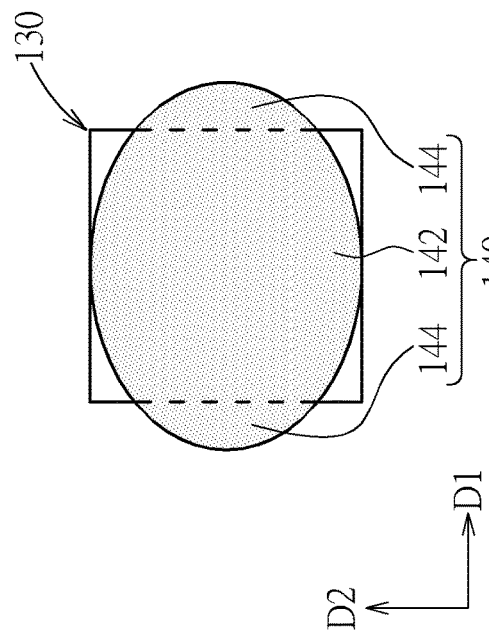
FIG. 3 to FIG. 6 are schematic diagrams respectively showing a top view of a light emitting unit and a light adjusting layer according to a variant embodiment of the first embodiment of the present disclosure
Figure 6:
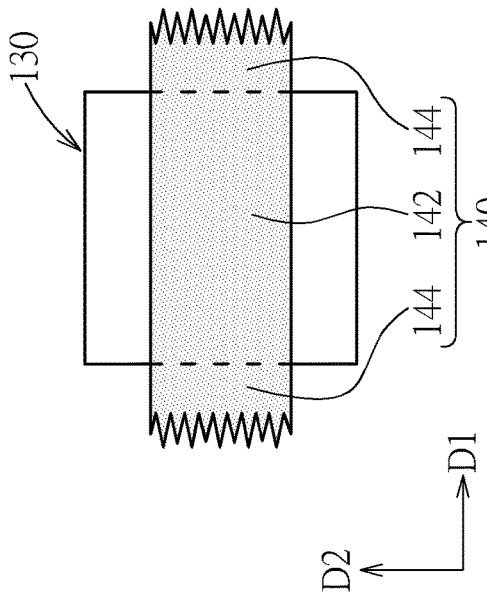
Figure 3:
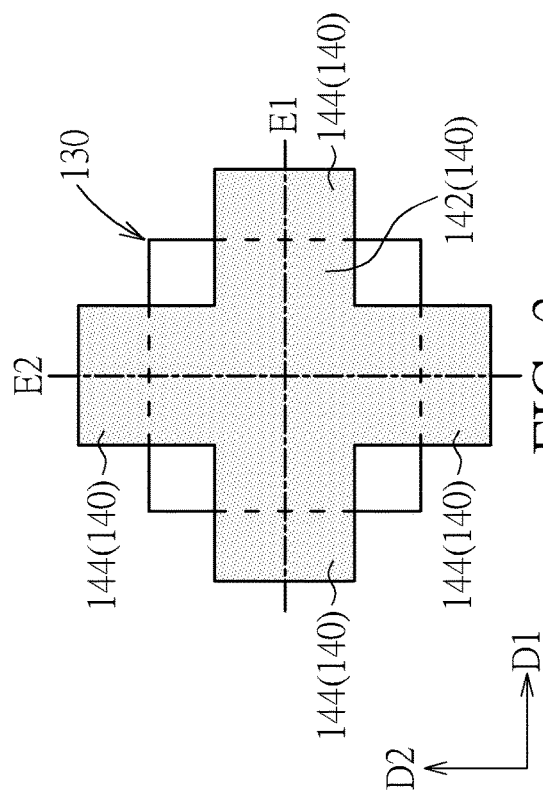
Figure 5:
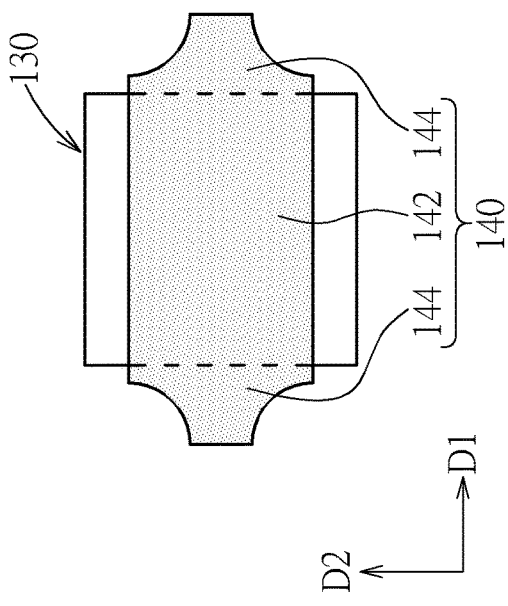

Particularly, the direction of wide view angle is related to the top-view shape of the light adjusting layer 140 and the disposition of the second portion 144 of light adjusting layer 140. The top-view shape of the light adjusting layer 140 may be any suitable shape, such as a polygon, a circle, an ellipse or a shape having a curved edge, but not limited thereto. The light adjusting layer 140 may be designed based on requirements, and some embodiments are described below. In this embodiment shown in FIG. 2A, since the top-view shape of the light adjusting layer 140 is a rectangular with an extending line parallel to the direction D1, and the second portion 144 includes two parts disposed on the left side and the right side of the light emitting unit 130, the right view angle and the left view angle are wider. In an variant embodiment (although not shown), the top-view shape of the light adjusting layer 140 can be a rectangular similar to the shape as shown in FIG. 2A, but arranged in an inclined manner, that is, arranged with the extending line E1 inclined with respect to the direction D1. In another variant embodiment shown in FIG. 3, the top-view shape of the light adjusting layer 140 is a cruciform shape, and the second portion 144 includes four parts disposed on the upper, left, lower and right sides of the light emitting unit 130, such that these four view angles are wider. In another variant embodiment (although not shown), the top-view shape of the light adjusting layer 140 can be a cruciform shape similar to the shape as shown in FIG. 3, but arranged in an inclined manner, that is, arranged with the extending line E1 inclined with respect to the direction D1 and the extending line E2 inclined with respect to the direction D2. That is, the top view shape of the light adjusting layer 140 can be x-shape. The second portion 144 includes four parts disposed on the upper-left, upper-right, lower-left and lower-right sides of the light emitting unit 130, such that these four view angles are wider. In another variant embodiment shown in FIG. 4, the top-view shape of the light adjusting layer 140 is an ellipse, and the length of the minor axis of the ellipse is equal to the dimension of the light emitting unit 130. In another variant embodiment, the top-view shape of the first portion 142 of the light adjusting layer 140 may be a rectangular, and the top-view shape of the second portion 144 of the light adjusting layer 140 may have a curved edge. For example, in FIG. 5, the second portion 144 includes two parts respectively having two curved edges, and the width of the first portion 142 is greater than the width of the second portion 144. In another variant embodiment, an edge of the light adjusting layer 140 may be irregular. For example, in FIG. 6, an edge of the second portion 144 is zigzag. Moreover, the second portion 144 may include at least two parts disposed oppositely in accordance to the first portion 142; for instance, in FIG. 2A, the two parts of the second portion 144 are disposed on the left side and the right side of the first portion 142, but not limited thereto. In another embodiment, the second portion 144 may include only one part. In addition, the top-view shape of the light adjusting layer 140 is symmetric or asymmetric.

In addition, as shown in FIG. 1, the first portion 142 includes a first top surface 142t away from the substrate 110, and a first bottom surface 142b opposite to the first top surface 142t. The second portion 144 includes a second top surface 144t away from the substrate 110, and a second bottom surface 144b opposite to the second top surface 144t. In some embodiments, the first bottom surface 142b may be in contact with the light output surface 130s, but not limited thereto. Specifically, in some embodiments, a roughness of the first top surface 142t may be greater than a roughness of the second top surface 144t. In some embodiments, a roughness of the first top surface 142t may be less than a roughness of the first bottom surface 142b. By means of the roughness design, the scattering effect of the light adjusting layer 140 may be enhanced, so as to make the emitted light more uniform. Note that the roughness of the surface of this embodiment is defined by a height difference between two specific points of the surface within a sampling length range. For example, in a sampling length of 30 μm, the roughness of one surface can be defined by a height difference between a high peak and a low valley, but not limited thereto. The definition of the roughness of the layer may be any suitable definition.

Furthermore, a thickness of the light adjusting layer 140 and a thickness of the light emitting unit 130 can be designed according to optical consideration. Specifically, if the thickness of the light adjusting layer 140 is too thick, the emitted light may be absorbed much by the light adjusting layer 140; if the thickness of the light adjusting layer 140 is too thin, the uniform effect of the light adjusting layer 140 is not well. In some embodiments, a ratio of the thickness of the light adjusting layer 140 to the total thickness of the first semiconductor layer 132, the light emitting layer 134 and the second semiconductor layer 136 (the thickness of the light emitting unit 130 excluding the two electrodes) may be greater than or equal to 0.006 and less than or equal to 0.16. In some embodiments, the thickness of the light adjusting layer 140 may be greater than or equal to 0.05 μm and less than or equal to 0.5 μm. In some embodiments, the total thickness of the first semiconductor layer 132, the light emitting layer 134 and the second semiconductor layer 136 (the thickness of the light emitting unit 130 excluding the two electrodes) may be greater than or equal to 3 μm and less than or equal to 8 μm, but not limited thereto.

Also, the lighting device 100 may further include other suitable elements or layers based on requirements. As shown in FIG. 1, the lighting device 100 of this embodiment may optionally include a cover layer CL disposed on the light emitting unit 130 for protecting the light emitting unit 130. The cover layer CL may be a passivation layer and include an insulating material, and the cover layer CL may be formed by coating, but not limited thereto. As shown in FIG. 1, the lighting device 100 of this embodiment may optionally include an adhesive layer AL disposed between the light emitting unit 130 and the circuit layer 120 for reinforcing the fixation of the light emitting unit 130, but not limited thereto. In another embodiment, the lighting device 100 may optionally include such as a black matrix (BM), a pixel define layer (PDL), a polarizer, an encapsulation layer and/or medium layer. The medium layer can be a liquid crystal layer or other suitable medium materials.

Figure 7:
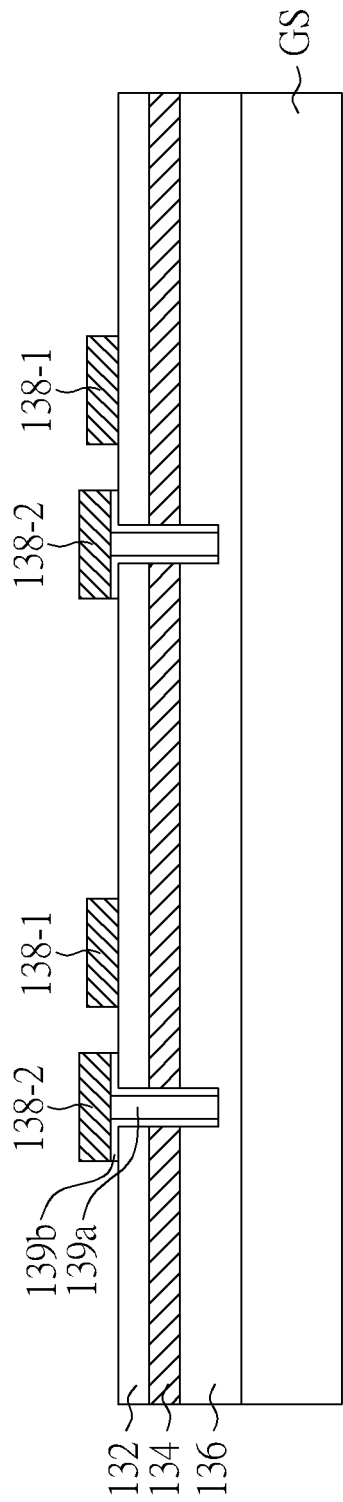
FIG. 7 to FIG. 12 are schematic diagrams respectively showing a cross-sectional view of a processing state during a method for manufacturing the lighting device according to the first embodiment of the present disclosure.
Figure 8:
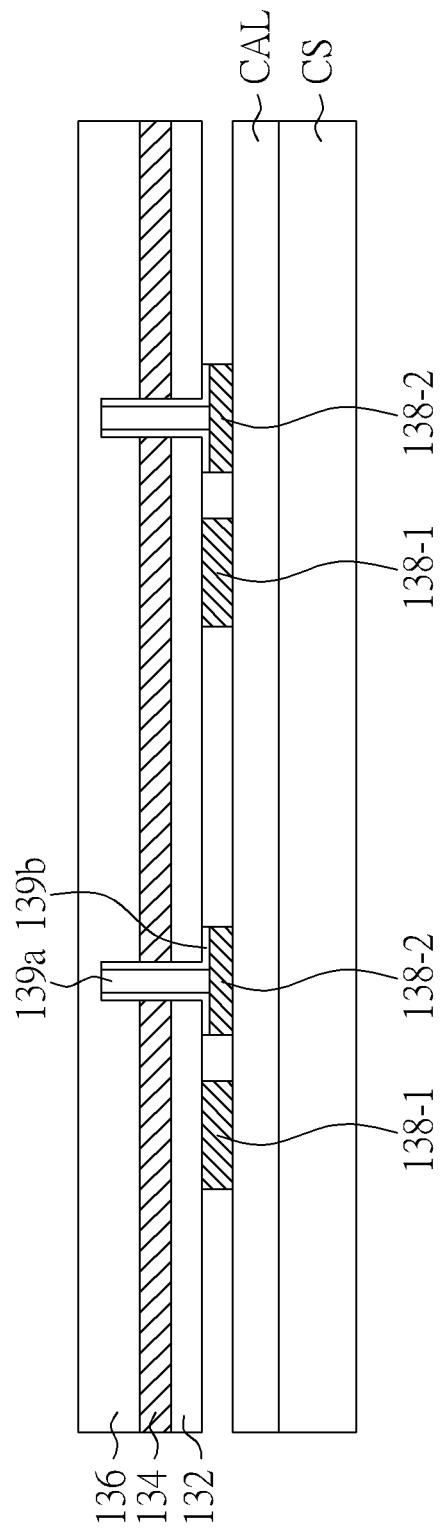

Referring to FIG. 7 to FIG. 12, FIG. 7 to FIG. 12 are schematic diagrams respectively showing a cross-sectional view of a processing state during a method for manufacturing the lighting device according to the first embodiment of the present disclosure. As an example, the following describes the method for manufacturing the lighting device 100 shown in FIG. 1 and FIG. 2A, but not limited thereto. The method for manufacturing the lighting device 100 may be correspondingly adjusted according to the structure of the lighting device 100. As shown in FIG. 7, a growth substrate GS may be provided firstly. Then, the layers and the elements included in the light emitting unit 130 may be formed. Specifically, in this embodiment, the second semiconductor layer 136, the light emitting layer 134 and the first semiconductor layer 132 are formed in sequence, wherein the first semiconductor layer 132 and the second semiconductor layer 136 may be formed by such as an epitaxial growth process or other suitable manufacturing process, but not limited thereto. Moreover, in another embodiment, the buffer layer (not shown in figures) may be formed between the second semiconductor layer 136 and the growth substrate GS. Next, the first electrode 138-1 and the second electrode 138-2 may be formed, and the inner insulator 139b and the inner connecting component 139a may be optionally formed. As shown in FIG. 8, the manufacturing method uses a lift off process (e.g. laser lift off process) for transferring the layers and the elements included in the light emitting unit 130 from the growth substrate GS to a carrier substrate CS, and an adhesive layer CAL can be used to adhere the layers and the elements included in the light emitting unit 130 to the carrier substrate CS. Note that the lift off process may cause the top surface of the light emitting unit 130 (e.g. the surface of the second semiconductor layer 136) to be roughened.

Figure 9:
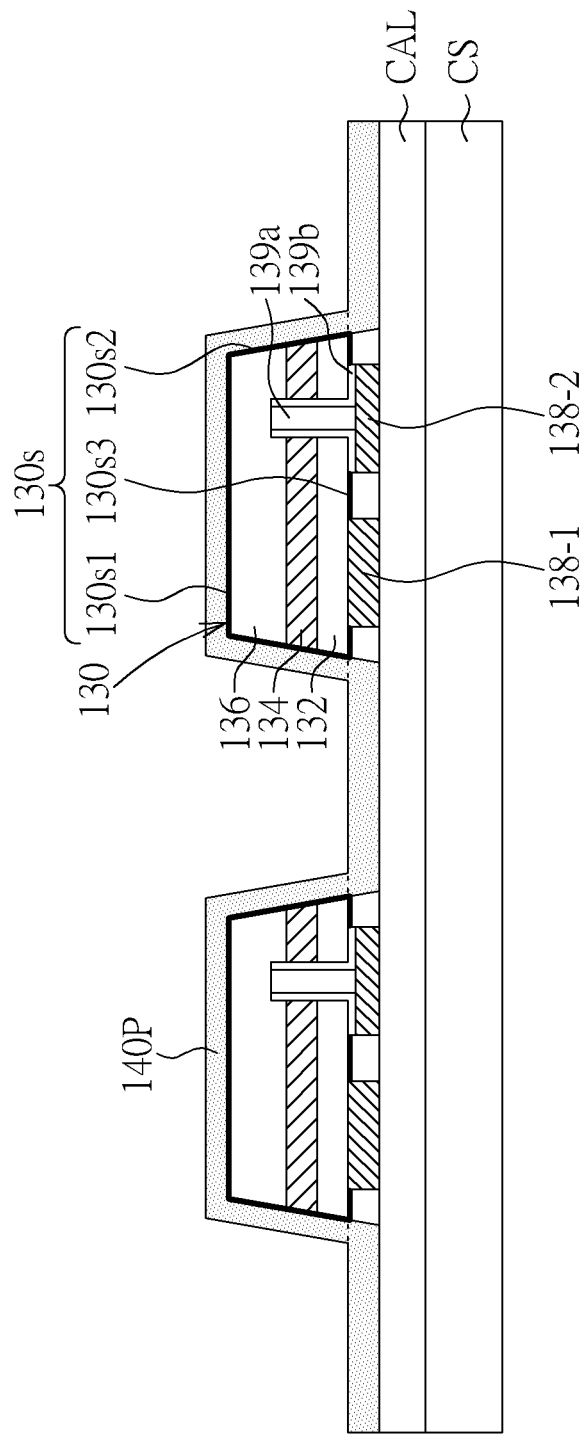
Figure 10:
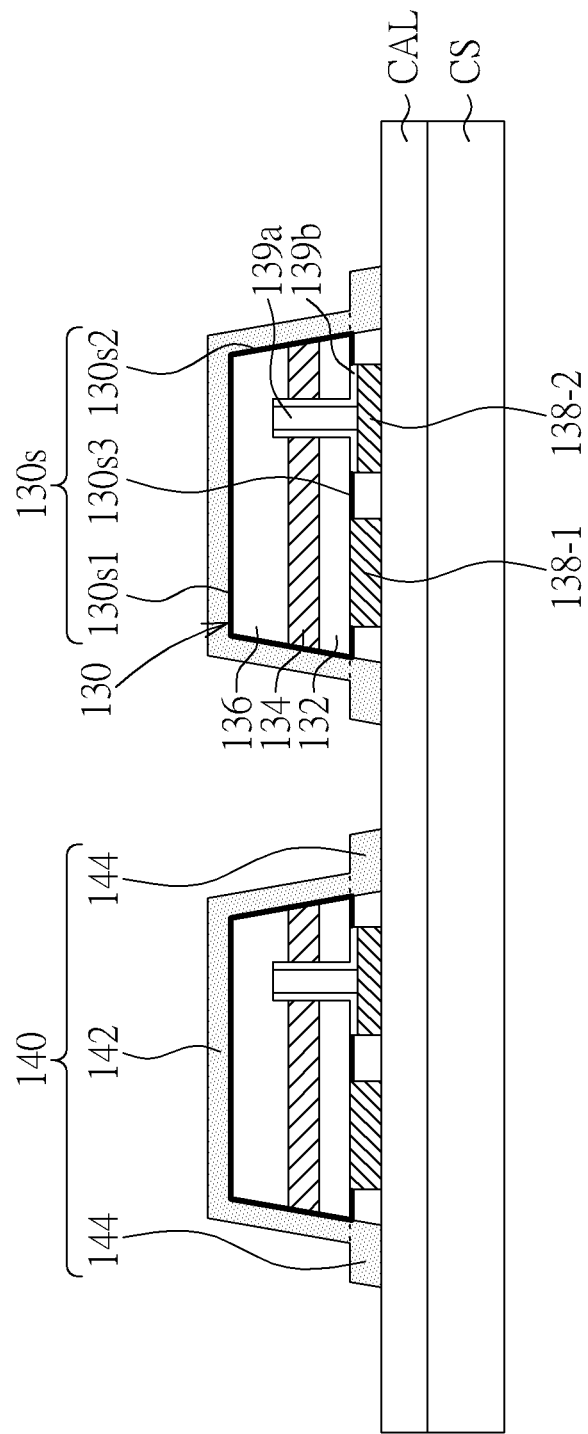

As shown in FIG. 9, the layers (e.g. the second semiconductor layer 136, the light emitting layer 134 and the first semiconductor layer 132) can be patterned, for example by photolithography technology, to form the light emitting unit 130. The photolithography technology can include a dry etching process, a wet etching process or a combination thereof. Note that the etching process may damage the light emitting unit 130 with some extent. Then, a preliminary light adjusting layer 140P is formed on the light emitting unit 130, and the preliminary light adjusting layer 140P may be formed by a suitable deposition process or any suitable forming process. In this embodiment, the preliminary light adjusting layer 140P may completely cover the light emitting unit 130, but not limited thereto. Next, as shown in FIG. 10, the preliminary light adjusting layer 140P can be patterned to form a light adjusting layer 140. The light adjusting layer 140 can partially or completely cover the light emitting surface, as mentioned above. Also, in a top view, the light adjusting layer 140 can be designed to be the above-mentioned shape.

Figure 11:
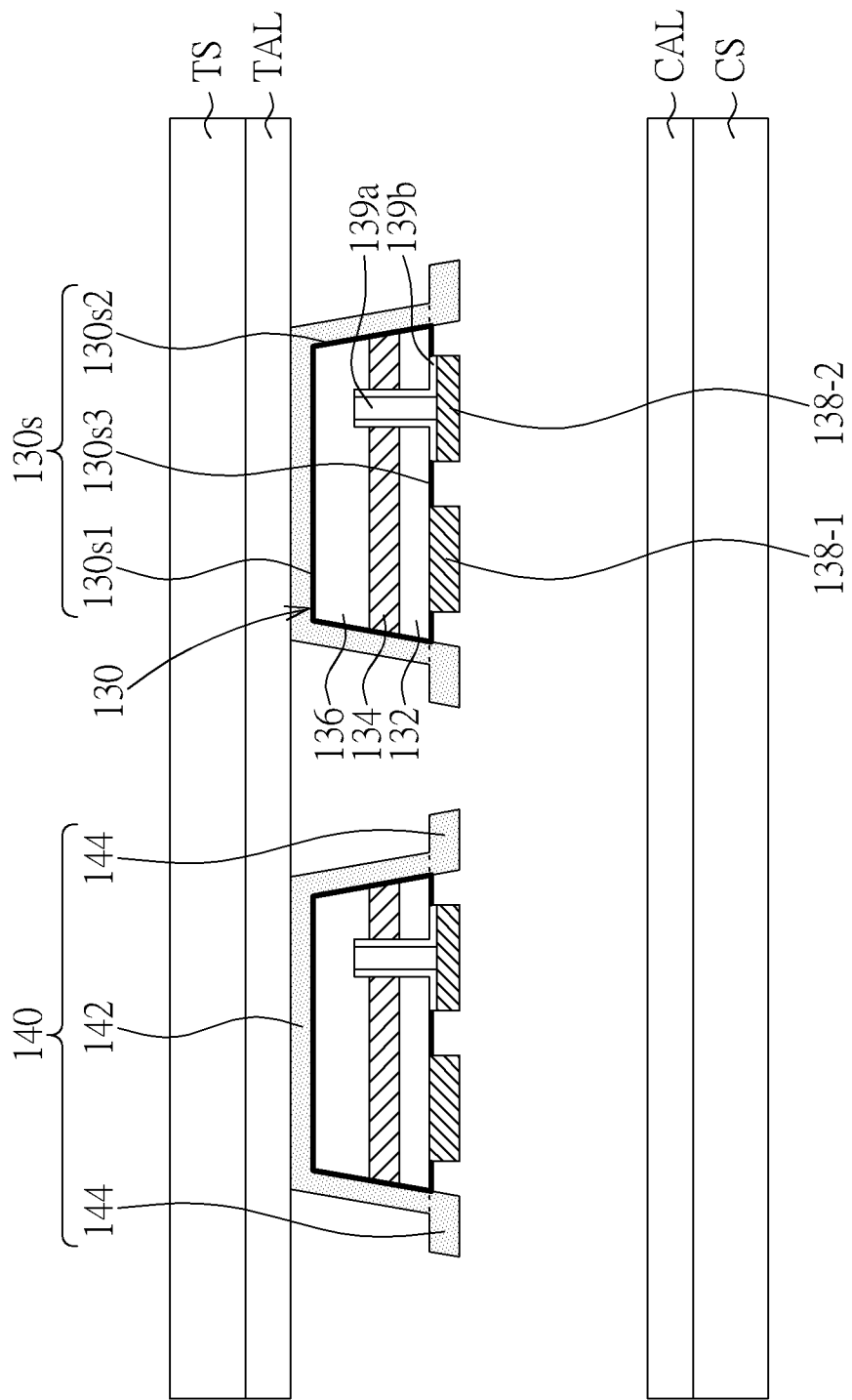
Figure 12:
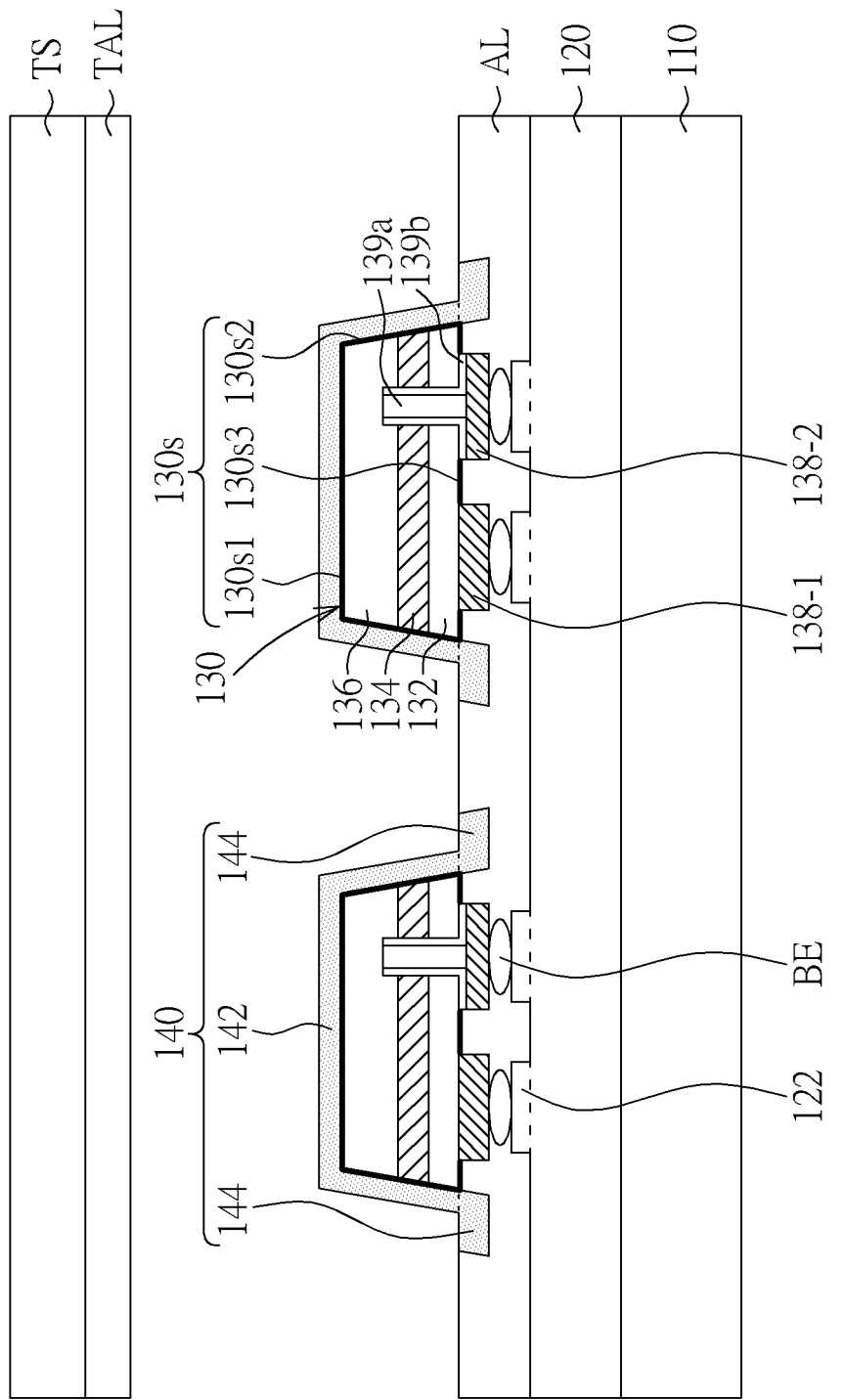

As shown in FIG. 11 and FIG. 12, a transferring process for transferring the light emitting unit 130 and the light adjusting layer 140 is performed, wherein the light emitting unit 130 and the light adjusting layer 140 are transferred from the carrier substrate CS to a substrate 110. The circuit layer 120 can be formed on the substrate 110. Specifically, in FIG. 11, a transferring substrate TS and a transferring adhesive layer TAL disposed on the transferring substrate TS is provided. Then, the transferring adhesive layer TAL may adhere to the light adjusting layer 140, so as to make the light adjusting layer 140 and the light emitting unit 130 leave from the carrier substrate CS. Then, in FIG. 12, the transferring process makes the light emitting unit 130 be bonded with at least one of the bonding pads 122 on the substrate 110 for electrical connection and fixation, and the light adjusting layer 140 and the light emitting unit 130 leave from the transferring substrate TS. The transferring process of the present disclosure is not limited thereto, and other suitable transferring processes can be used. After the above processes, other suitable layers and/or components may be formed (for instance, forming the cover layer CL), so as to complete the manufacture of the lighting device 100 shown in FIG. 1.

According to some embodiments, since the patterning procedure for forming the light adjusting layer 140 is subjected before the transferring process, the circuit layer 120 and other layers on the substrate 110 will not be affected by such patterning procedure, such that the yield rate may be enhanced.

The lighting device and the manufacturing method thereof of the present disclosure are not limited to the above embodiments. Further embodiments of the present disclosure are described below. For ease of comparison, same components will be labeled with the same symbol in the following. The following descriptions relate the differences between each of the embodiments, and repeated parts will not be redundantly described.

Figure 13:
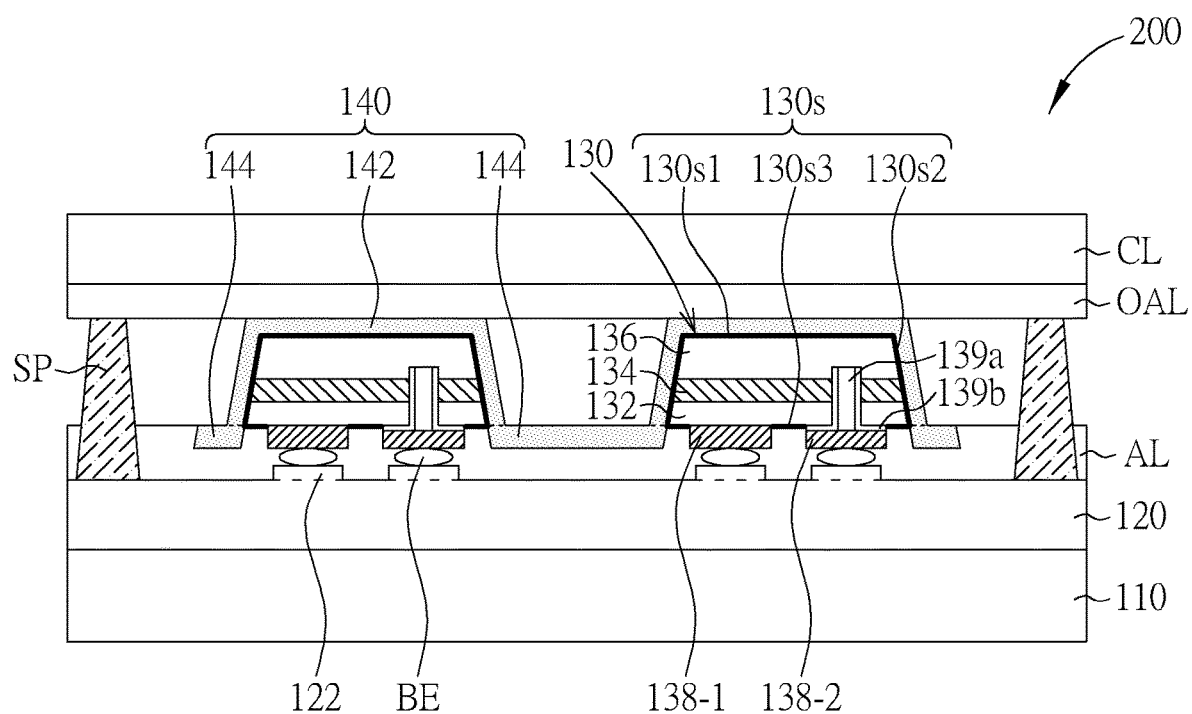
FIG. 13 is a schematic diagram showing a cross-sectional view of a lighting device according to a second embodiment of the present disclosure.
Figure 14:
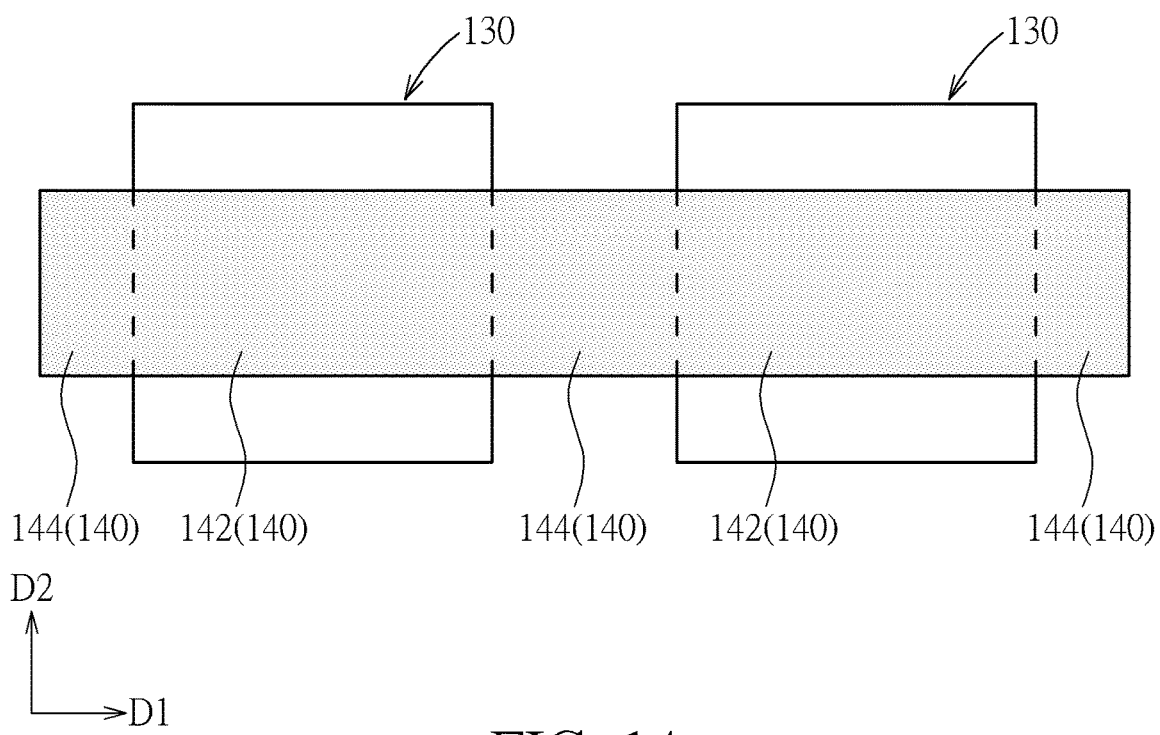
FIG. 14 is a schematic diagram showing a top view of light emitting units and a light adjusting layer according to a second embodiment of the present disclosure.

Referring to FIG. 13 and FIG. 14, FIG. 13 is a schematic diagram showing a cross-sectional view of a lighting device according to a second embodiment of the present disclosure, and FIG. 14 is a schematic diagram showing a top view of light emitting units and a light adjusting layer according to a second embodiment of the present disclosure. As shown in FIG. 13 and FIG. 14, compared with the first embodiment, the light adjusting layer 140 of the lighting device 200 of this embodiment continuously covers two or more light emitting units 130. For example, the light adjusting layer 140 partially covers two light emitting units 130 in FIG. 13 and FIG. 14, but not limited thereto. The light emitting units 130 covered by the same light adjusting layer 140 may be disposed within the same sub-pixel and emit the same color, disposed within different sub-pixels and emit the same color, or disposed within different sub-pixels and emit different colors.

Moreover, in FIG. 13, the cover layer CL can be a substrate or a circuit board. When the cover layer CL is a substrate, the substrate can be hard or flexible. The material of the substrate can be glass, plastic, quartz, sapphire, polyimide, polyethylene terephthalate, but not limited thereto. In some embodiments, the cover layer CL is a substrate harder than the passivation layer to provide better protective effect. Note that, in this embodiment, the lighting device 200 may include spacers SP and an opposite adhesive layer OAL, wherein the spacers SP may separate the cover layer CL from the substrate 110, and the opposite adhesive layer OAL may be used to make the cover layer CL adhere to the spacers SP and be in contact with the light adjusting layer 140, but not limited thereto.

Figure 15:
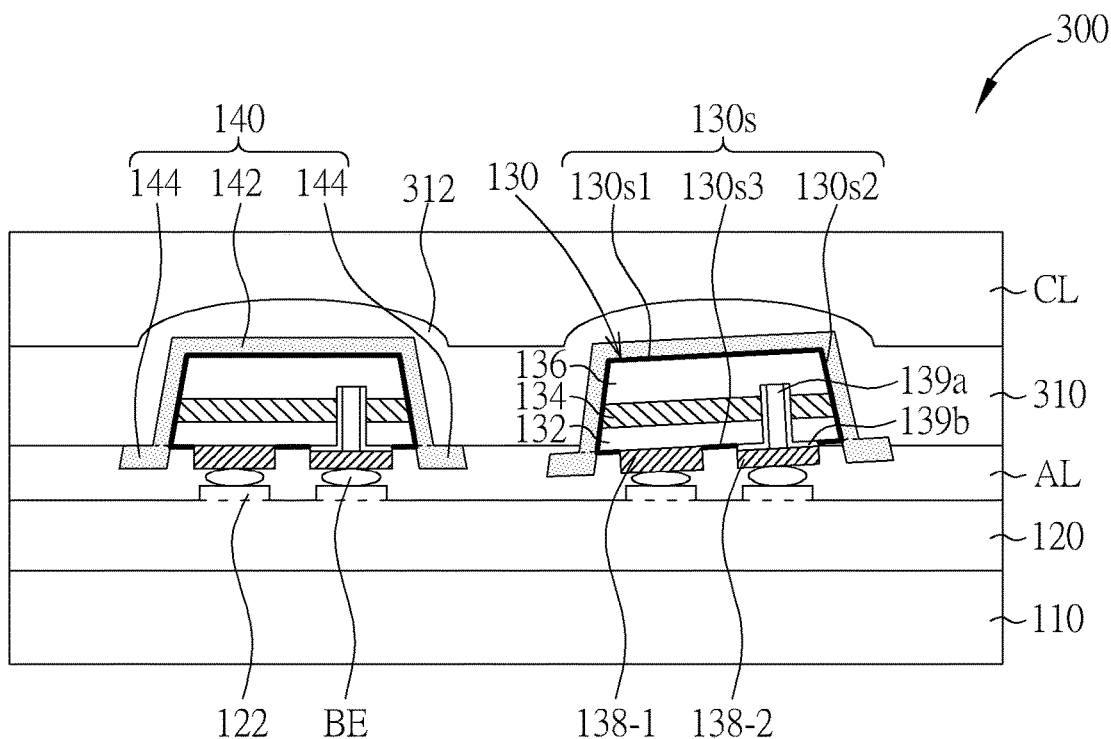
FIG. 15 is a schematic diagram showing a cross-sectional view of a lighting device according to a third embodiment of the present disclosure.
Figure 16:
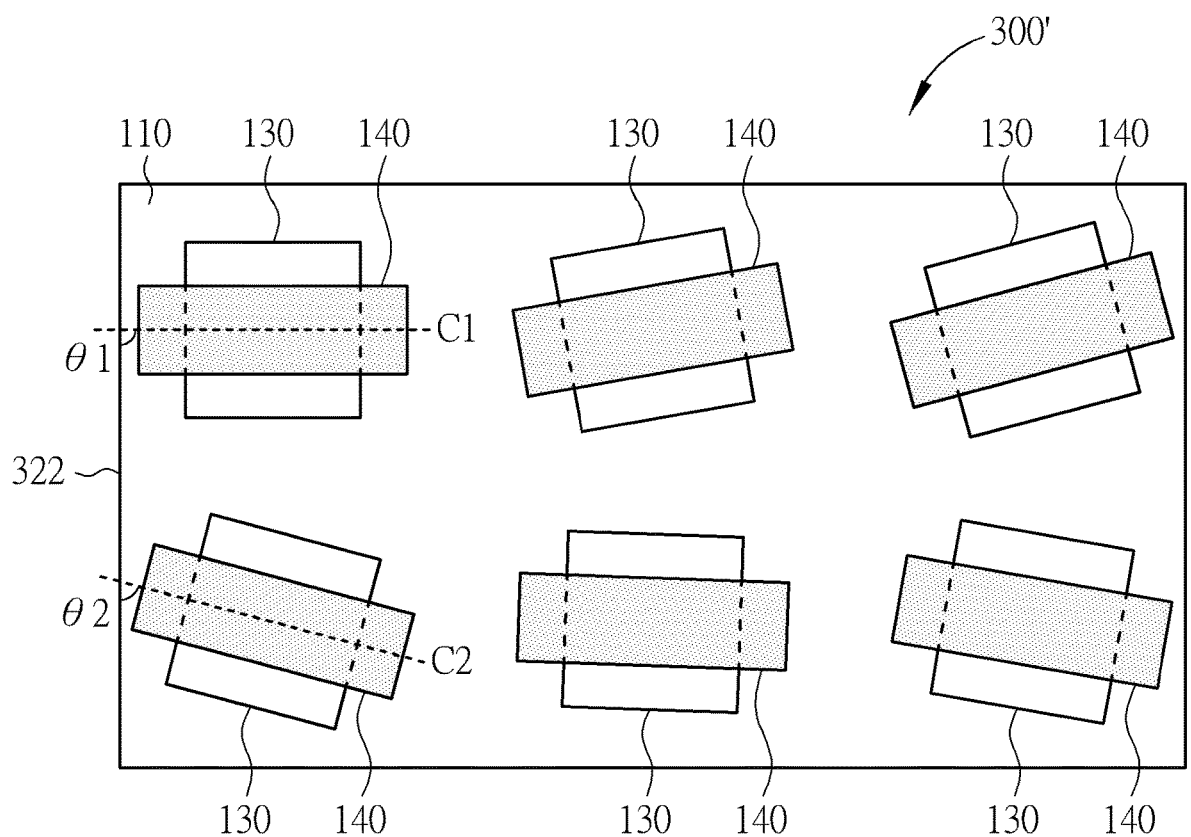
FIG. 16 is a schematic diagram showing a top view of a lighting device according to a variant embodiment of the third embodiment of the present disclosure.

Referring to FIG. 15 and FIG. 16, FIG. 15 is a schematic diagram showing a cross-sectional view of a lighting device according to a third embodiment of the present disclosure, and FIG. 16 is a schematic diagram showing a top view of a lighting device according to a variant embodiment of the third embodiment of the present disclosure. As shown in FIG. 15, compared with the first embodiment, the lighting device 300 may further include an optical layer 310 disposed on the light adjusting layer 140. The optical layer 310 can adjust the optical path of the emitting light, such that the emitted light is more uniform. In this embodiment, the optical layer 310 also scatters the emitting light, and the optical layer 310 may include a material having scattering effect; for example, the optical layer 310 may include nanoparticles such as titanium oxide, quantum dots or other suitable particles, but not limited thereto. Furthermore, in some embodiments, the optical layer 310 may be a color filter for changing the color of the emitting light, but not limited thereto. In addition, the projected area of the light adjusting layer 140 may be less than the projected area of the optical layer 310; for example, the optical layer 310 of this embodiment may totally cover the light emitting unit 130, but not limited thereto. Also, in this embodiment, a portion of the optical layer 310 corresponding to the light emitting unit 130 may have a convex structure 312, so as to enhance the adjusting efficiency of the optical path of the emitting light, but not limited thereto.

Moreover, the light emitting units 130 may be disposed with different angles, so as to prevent the display image from having a moiré pattern. In FIG. 15, a disposed angle between one light emitting unit 130 and the surface of the substrate 110 is different from another disposed angle between another light emitting unit 130 and the surface of the substrate 110; for instance, the disposed angle between the left light emitting unit 130 and the surface of the substrate 110 may be about 0 degrees, and the disposed angle between the right light emitting unit 130 and the surface of the substrate 110 may be greater than 0 degrees and less than 45, but not limited thereto. As shown in FIG. 16, the light emitting units 130 of the lighting device 300' of this variant embodiment may have different disposed angles related to one edge of the substrate 110 (for instance, side 322); that is to say, in a top view, a disposed angle θ1 between the side 322 and a center line C1 of one of the light emitting units 130 may be different from a disposed angle θ2 between the side 322 and a center line C2 of another one of light emitting units 130.

Figure 17:
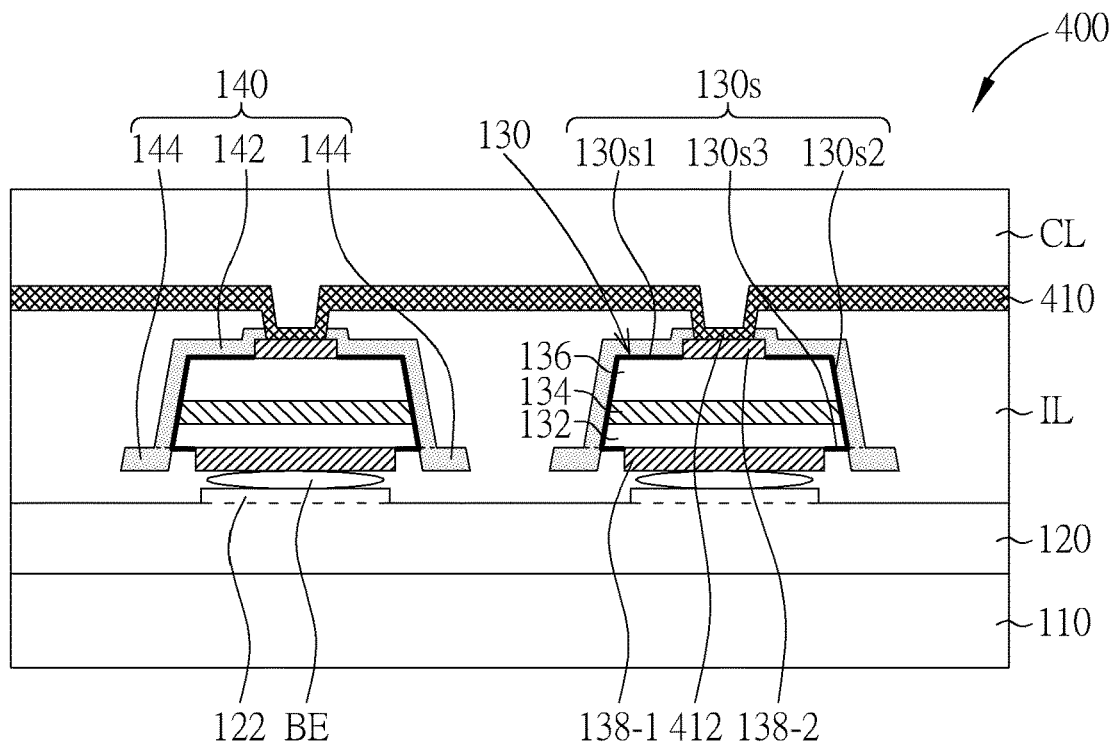
FIG. 17 is a schematic diagram showing a cross-sectional view of a lighting device according to a fourth embodiment of the present disclosure.
Figure 18:
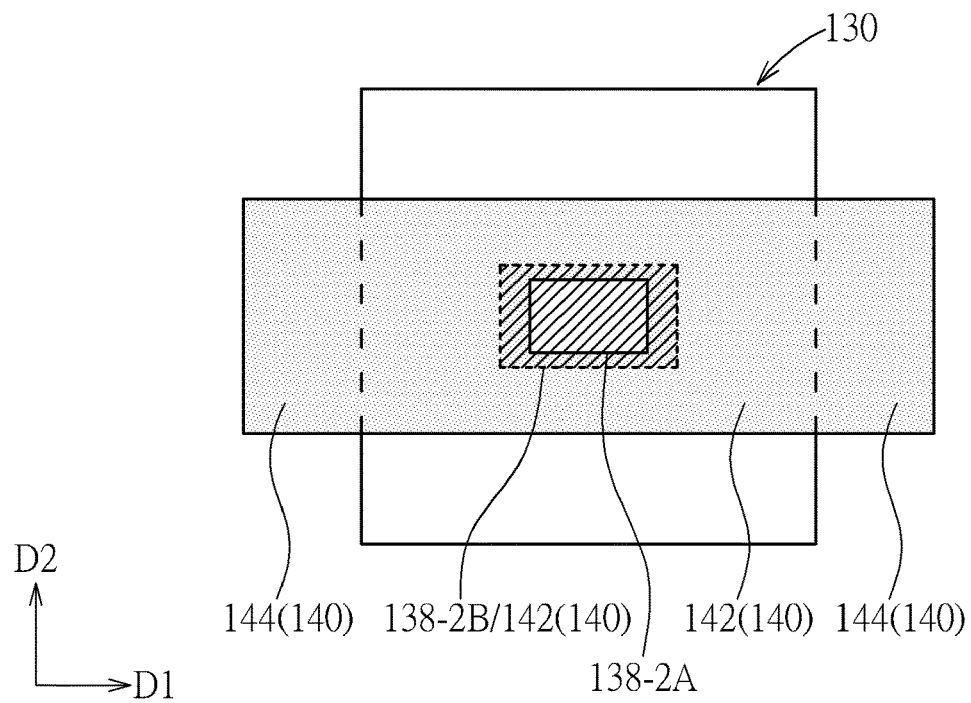
FIG. 18 is a schematic diagram showing a top view of a light emitting unit and a light adjusting layer according to the fourth embodiment of the present disclosure.

Referring to FIG. 17 and FIG. 18, FIG. 17 is a schematic diagram showing a cross-sectional view of a lighting device according to a fourth embodiment of the present disclosure, and FIG. 18 is a schematic diagram showing a top view of a light emitting unit and a light adjusting layer according to the fourth embodiment of the present disclosure. As shown in FIG. 17 and FIG. 18, compared with the first embodiment, the lighting device 400 of this embodiment provides another type (vertical type) light emitting unit 130. In this embodiment, the first electrode 138-1 is disposed between the first semiconductor layer 132 and the circuit layer 120 to serve as a bottom electrode, and the second electrode 138-2 is disposed between the second semiconductor layer 136 and the light adjusting layer 140 to serve as a top electrode. In this embodiment, the second electrode 138-2 may be disposed at the center of the light emitting unit 130 in top-view, but not limited thereto. In another embodiment, the second electrode 138-2 may be disposed adjacent to a side of the light emitting unit 130. Moreover, in this embodiment, in order to make the second electrode 138-2 be electrically connected to the circuit layer 120, the lighting device 400 may further include a transparent conductive layer 410 electrically connected between the second electrode 138-2 and the circuit layer 120. In this embodiment, the light adjusting layer 140 may partially cover the second electrode 138-2, and the transparent conductive layer 410 may include at least one electrode connecting element 412 for being in contact with the second electrode 138-2. For example, a portion of the second electrode 138-2 is exposed by the light adjusting layer 140 (shown in FIG. 17 and shown as a portion marked 138-2A in FIG. 18), and the other portion of the second electrode 138-2 is covered by the light adjusting layer 140 (shown in FIG. 17 and shown as a portion marked 138-2B/142 (140) in FIG. 18), but not limited thereto. Furthermore, in this embodiment, the transparent conductive layer 410 (or the electrode connecting element 412) may include transparent conductive material, such as ITO, IZO or other suitable material. When the thickness of the light adjusting layer 140 is measured, the thickness of the light adjusting layer 140 may be referred to a thickness of a portion of the light adjusting layer 140 which does not cover the second electrode 138-2. In some embodiments, the second electrode 138-2 can include a material with heat dissipation effect, such as metal, the heat dissipation effect of the vertical type light emitting unit 130 can be enhanced.

Furthermore, in this embodiment, the lighting device 400 may further include an insulating layer IL disposed between the circuit layer 120 and the cover layer CL, wherein the insulating layer IL may partially cover the light emitting unit 130 to protect the light emitting unit 130. In this embodiment, due to the existence of the transparent conductive layer 410, the insulating layer IL is disposed between the circuit layer 120 and the transparent conductive layer 410. In addition, the lighting device 400 may also include the adhesive layer AL disposed between the light emitting unit 130 and the circuit layer 120 for reinforcing the fixation of the light emitting unit 130 although FIG. 17 does not show, but not limited thereto.

Figure 19:
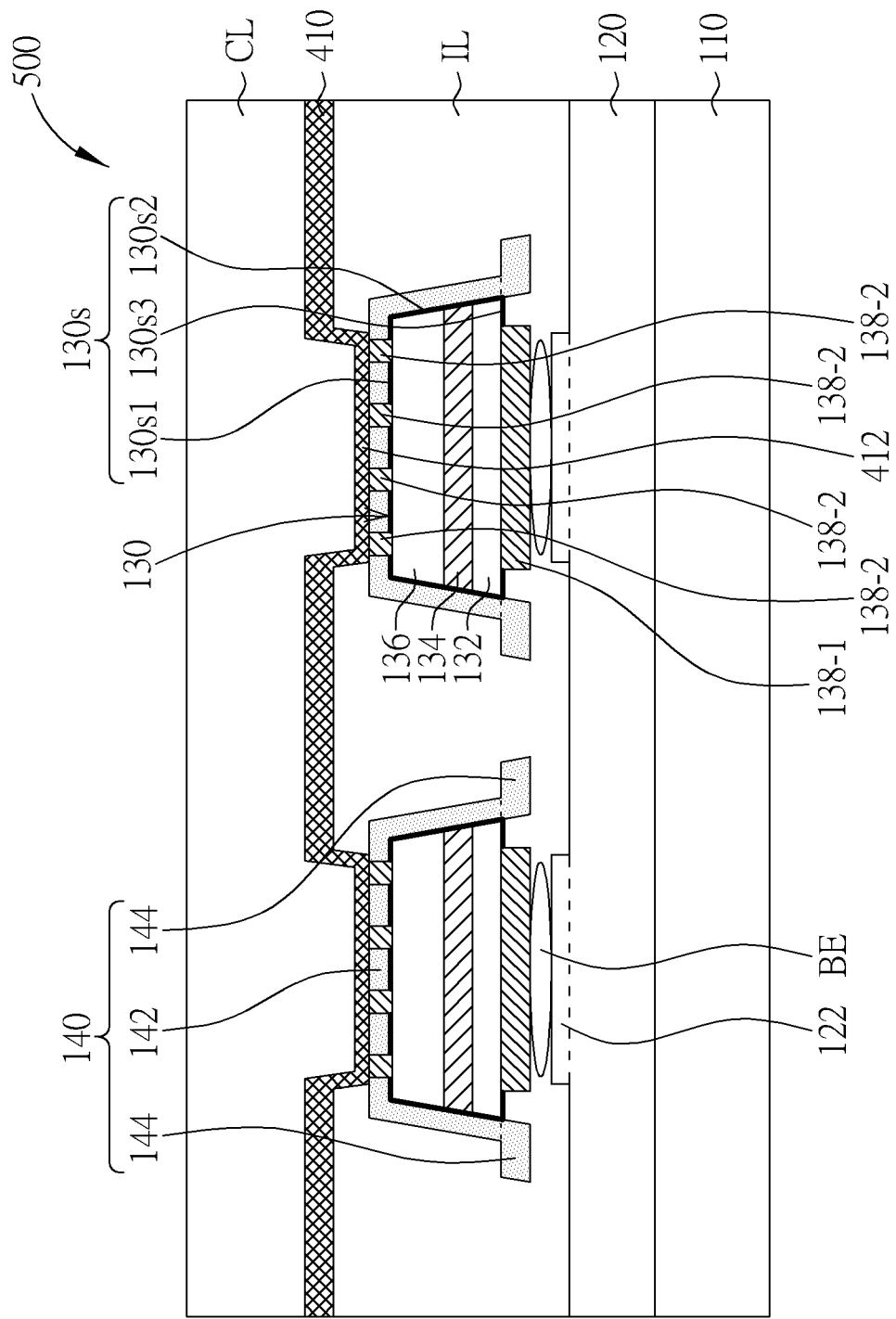
FIG. 19 is a schematic diagram showing a cross-sectional view of a lighting device according to a fifth embodiment of the present disclosure.
Figure 20A:
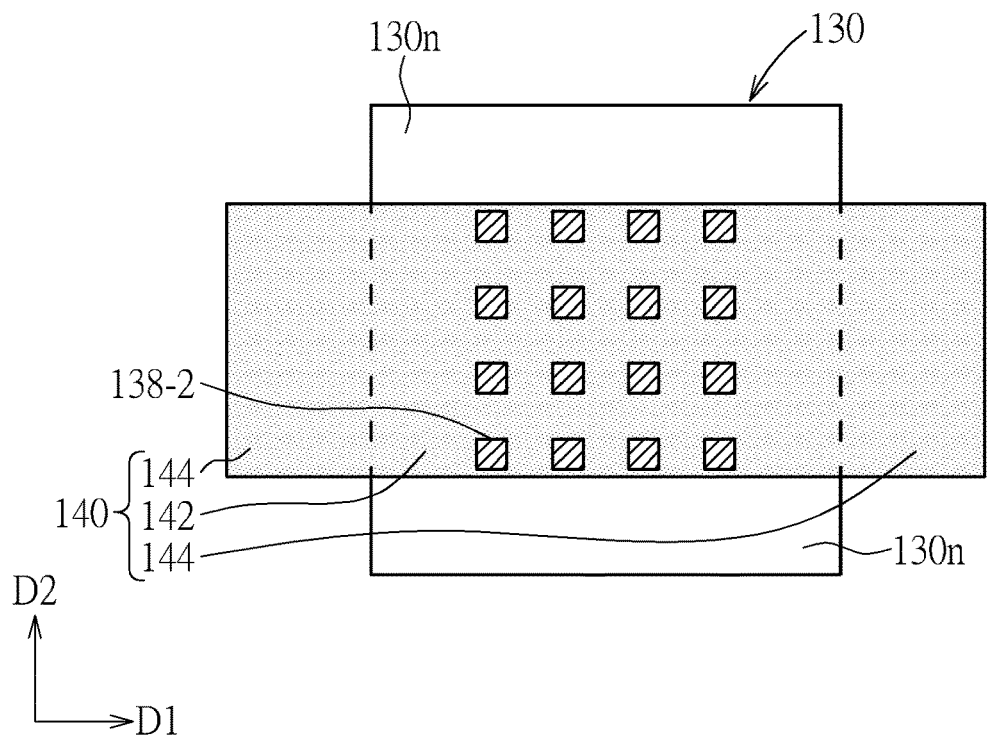
FIG. 20A is a schematic diagram showing a top view of a light emitting unit and a light adjusting layer according to the fifth embodiment of the present disclosure.

Referring to FIG. 19 and FIG. 20A, FIG. 19 is a schematic diagram showing a cross-sectional view of a lighting device according to a fifth embodiment of the present disclosure, and FIG. 20A is a schematic diagram showing a top view of a light emitting unit and a light adjusting layer according to the fifth embodiment of the present disclosure. As shown in FIG. 19 and FIG. 20A, compared with the fourth embodiment, the light emitting unit 130 of the lighting device 500 of this embodiment may include a plurality of second electrodes 138-2 serving as the top electrodes, wherein the plurality of second electrodes 138-2 corresponding to the same light emitting unit 130 are electrically connected to each other through the electrode connecting element 412. The second electrodes 138-2 may be arranged in a matrix, but the arrangement of the second electrodes 138-2 is not limited thereto. In this embodiment, the light uniformity of the light emitting unit 130 can be enhanced.

Figure 20B:
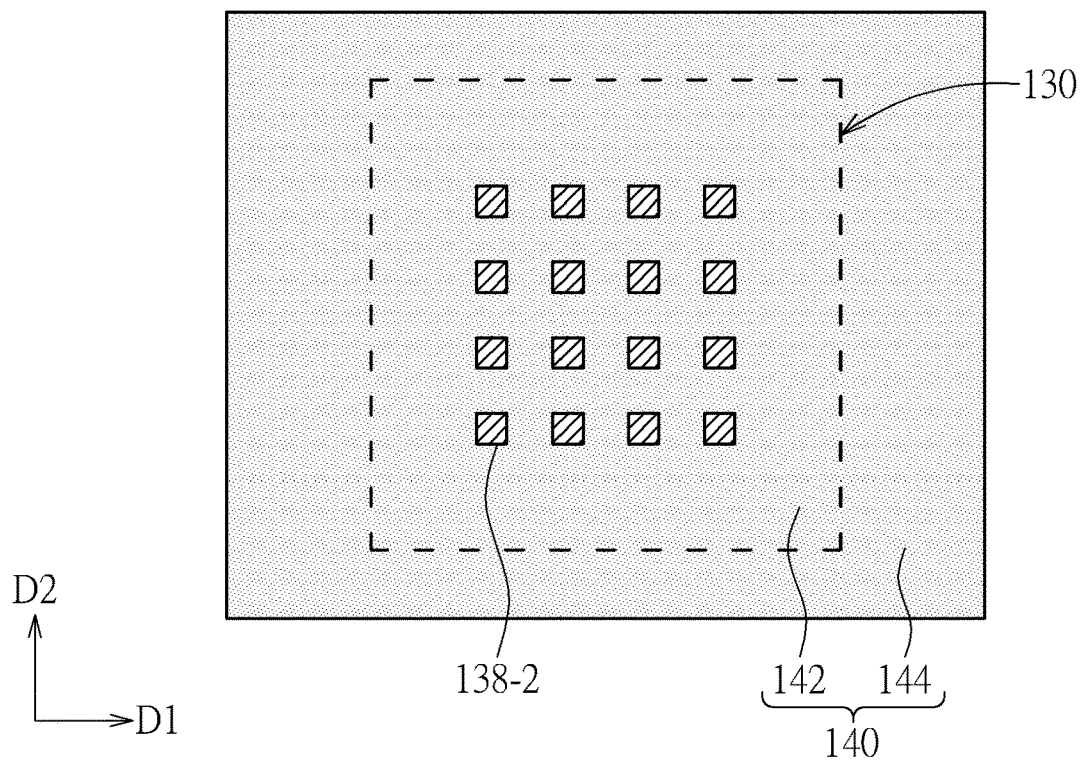
FIG. 20B is a schematic diagram showing a top view of a light emitting unit and a light adjusting layer according to a variant embodiment of the fifth embodiment of the present disclosure.

Moreover, in FIG. 19 and FIG. 20A, the first portion 142 only partially covers the light output surface 130s and expose the second electrodes 138-2. In detail, the first portion 142 of the light adjusting layer 140 can cover a part of the top surface 130s1 and a part of the side surface 130s2 of the light output surface 130s. The light adjusting layer 140 extends along the first direction D1, and the first portion 142 and the second portion 144 are connected along the first direction D1. The first portion 142 only partially overlaps the light emitting unit 130, and a part of the light emitting unit 130 (labeled as 130n) is not overlapped by the first portion 142. According to a various embodiment, FIG. 20B is a schematic diagram showing a top view of a light emitting unit and a light adjusting layer according to a variant embodiment of the fifth embodiment of the present disclosure. As shown in FIG. 19 and FIG. 20B, the first portion 142 of the light adjusting layer 140 can cover the top surface 130s1 and entire part of the side surface 130s2 of the light output surface 130s, and the first portion 142 only exposes the second electrodes 138-2. The second portion 144 can extend along the first direction D1 and the second direction D2 and surround the first direction 142.

In the present disclosure, the above embodiments are exemplarily described, but the present disclosure does not limited by these embodiments. The features described in the above embodiments may be selected and combined to be another embodiment.

To summarize, according to some embodiments, owing to the design of the light adjusting layer, the light emitted from the light emitting unit can be uniform.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A lighting device comprising:
   a substrate;
   a light emitting unit disposed on the substrate, the light emitting unit comprising a light output surface, wherein the light output surface comprises a side surface; and
   a light adjusting layer disposed on the light emitting unit, wherein the light adjusting layer comprises an inorganic insulating material, the light adjusting layer comprises a first portion and a second portion connected to the first portion, the first portion only partially covers the light output surface, and the second portion does not cover the light output surface;
   wherein the side surface is partially covered by the light adjusting layer, the inorganic insulating material comprises silicon nitride, silicon oxide, or a combination thereof, and in a top view, a projected area of the first portion is greater than a projected area of the second portion.

2. The lighting device according to claim 1, wherein in the top view, a ratio of the projected area of the first portion to a projected area of the light output surface is greater than or equal to 1/10 and less than 1.

3. The lighting device according to claim 1, wherein in the top view, a ratio of the projected area of the second portion to a projected area of the light output surface is greater than 0 and less than or equal to ½.

4. The lighting device according to claim 1, wherein in the top view, a minimum distance between a point of the second portion farthest from the light output surface and the light output surface ranges from 3 µm to 100 µm.

5. The lighting device according to claim 1, wherein the second portion comprises at least two parts disposed oppositely in accordance to the first portion.

6. The lighting device according to claim 1, further comprising another light emitting unit disposed on the substrate, wherein the light adjusting layer partially covers the light emitting unit and the another light emitting unit.

7. The lighting device according to claim 1, wherein the first portion includes a first top surface away from the substrate, the second portion includes a second top surface away from the substrate, and a roughness of the first top surface is greater than a roughness of the second top surface.

8. The lighting device according to claim 1, wherein the first portion includes a first top surface away from the substrate and a first bottom surface opposite to the first top surface, and a roughness of the first top surface is less than a roughness of the first bottom surface.

9. The lighting device according to claim 1, wherein the light emitting unit comprises:
   a first semiconductor layer;
   a light emitting layer disposed on the first semiconductor layer; and
   a second semiconductor layer disposed on the light emitting layer;
   wherein a ratio of a thickness of the light adjusting layer to a total thickness of the first semiconductor layer, the light emitting layer and the second semiconductor layer is greater than or equal to 0.006 and less than or equal to 0.16.

10. The lighting device according to claim 1, wherein a thickness of the light adjusting layer is greater than or equal to 0.05 µm and less than or equal to 0.5 µm.

* * * * *